US007535030B2

(12) United States Patent
Lin

(10) Patent No.: US 7,535,030 B2

(45) Date of Patent: May 19, 2009

(54) LED LAMP WITH EXPOSED HEAT-CONDUCTIVE FINS

(76) Inventor: Hsiang-Chou Lin, 58, Kuolenwu Rd., Hualien (TW)

(*) Notice: Subject to any disclaimer, the term of this patent is extended or adjusted under 35 U.S.C. 154(b) by 114 days.

(21) Appl. No.: 11/752,294

(22) Filed: May 22, 2007

(65) Prior Publication Data

US 2008/0290350 A1 Nov. 27, 2008

(51) Int. Cl.
*H01L 29/18* (2006.01)

(52) U.S. Cl. ................................ 257/99; 257/E33.058

(58) Field of Classification Search .................... 257/99
See application file for complete search history.

(56) References Cited

U.S. PATENT DOCUMENTS 5,321,593 A * 6/1994 Moates ....................... 362/251
6,995,405 B2 * 2/2006 Braddell et al. ............... 257/99
7,045,965 B2 * 5/2006 Li et al. .................. 315/185 S
2004/0252962 A1 * 12/2004 Ryan, Jr. ..................... 385/147
2005/0116235 A1 * 6/2005 Schultz et al. ................ 257/79
2006/0012299 A1 * 1/2006 Suehiro et al. .............. 313/512
2006/0098438 A1 * 5/2006 Ouderkirk et al. ........... 362/294

* cited by examiner

*Primary Examiner*—Evan Pert
*Assistant Examiner*—Ben P Sandvik

(57) ABSTRACT

In one embodiment, a LED lamp includes a heat sink including rows of exposed fins on one surface and a conductive member opposite the fins and including two electrically connected side positive electrodes, one or more negative electrode spaced from and between the positive electrodes, and one or more conductive positioning strips each between the negative electrode and either positive electrode; a light array mounted on the conductive member and including rows of LEDs divided into electrically parallel connected groups with the LEDs of each group being electrically series connected together, each LED including positive and negative pins secured to one conductive positioning strip and electrically connected to either positive electrode and the negative electrode respectively, a positive conductor electrically connected to either positive electrode; and a negative conductor electrically connected to the negative electrode.

3 Claims, 9 Drawing Sheets

LED LAMP WITH EXPOSED HEAT-CONDUCTIVE FINS

BACKGROUND OF THE INVENTION

1. Field of Invention

The invention relates to LED (light-emitting diode) lighting devices and more particularly to such a LED lamp having fin shaped heat dissipation members on an exposed surface.

2. Description of Related Art

The use of LEDs as light sources of illumination devices is becoming popular recently because LEDs have the following advantages such as high durability, long life span, low power consumption, flexible applications, and low heat generation.

It is noted that the low heat generation feature does not means that LED lighting device designers do not need to consider heat dissipation in the design phase. In fact, heat generation is significant if a lamp contains many LEDs which are located in close proximity in a housing. It is known that LED temperature should be kept low in order to ensure efficient light production.

There have been numerous suggestions in prior patents for providing means to draw heat away from LEDs. For example, U.S. Pat. No. 4,729,076 discloses such a LED lamp. Thus, continuing improvements in the exploitation of LED lamp with improved heat dissipation means are constantly being sought.

SUMMARY OF THE INVENTION

It is therefore one object of the invention to provide a LED lamp having a plurality of rows heat-conductive fins on an exposed surface so as to quickly reject generated heat to air.

The above and other objects, features and advantages of the invention will become apparent from the following detailed description taken with the accompanying drawings.

DETAILED DESCRIPTION OF THE INVENTION

Figure 1:
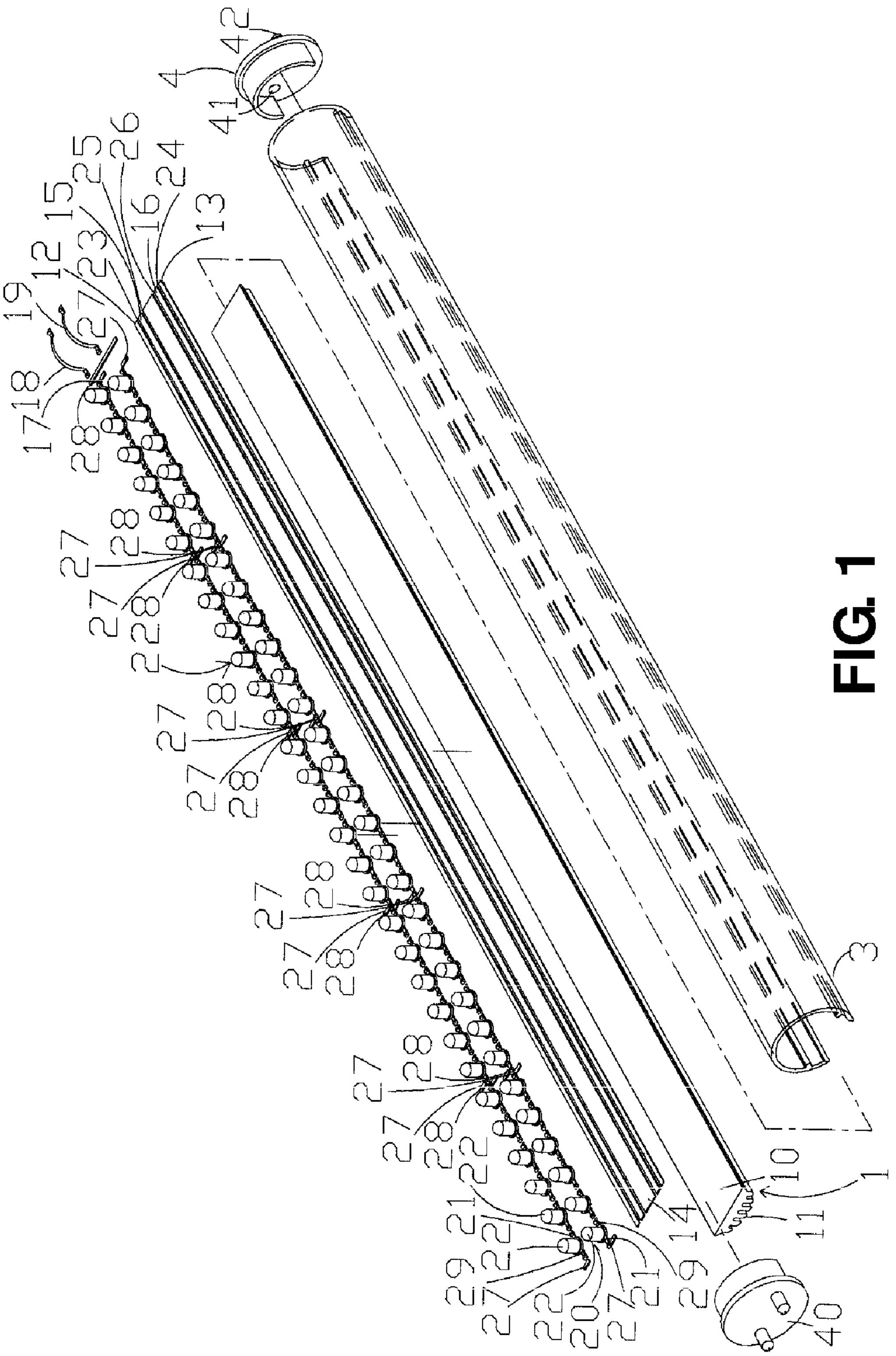
FIG. 1 is an exploded view of a first preferred embodiment of LED lamp according to the invention.
Figure 2:
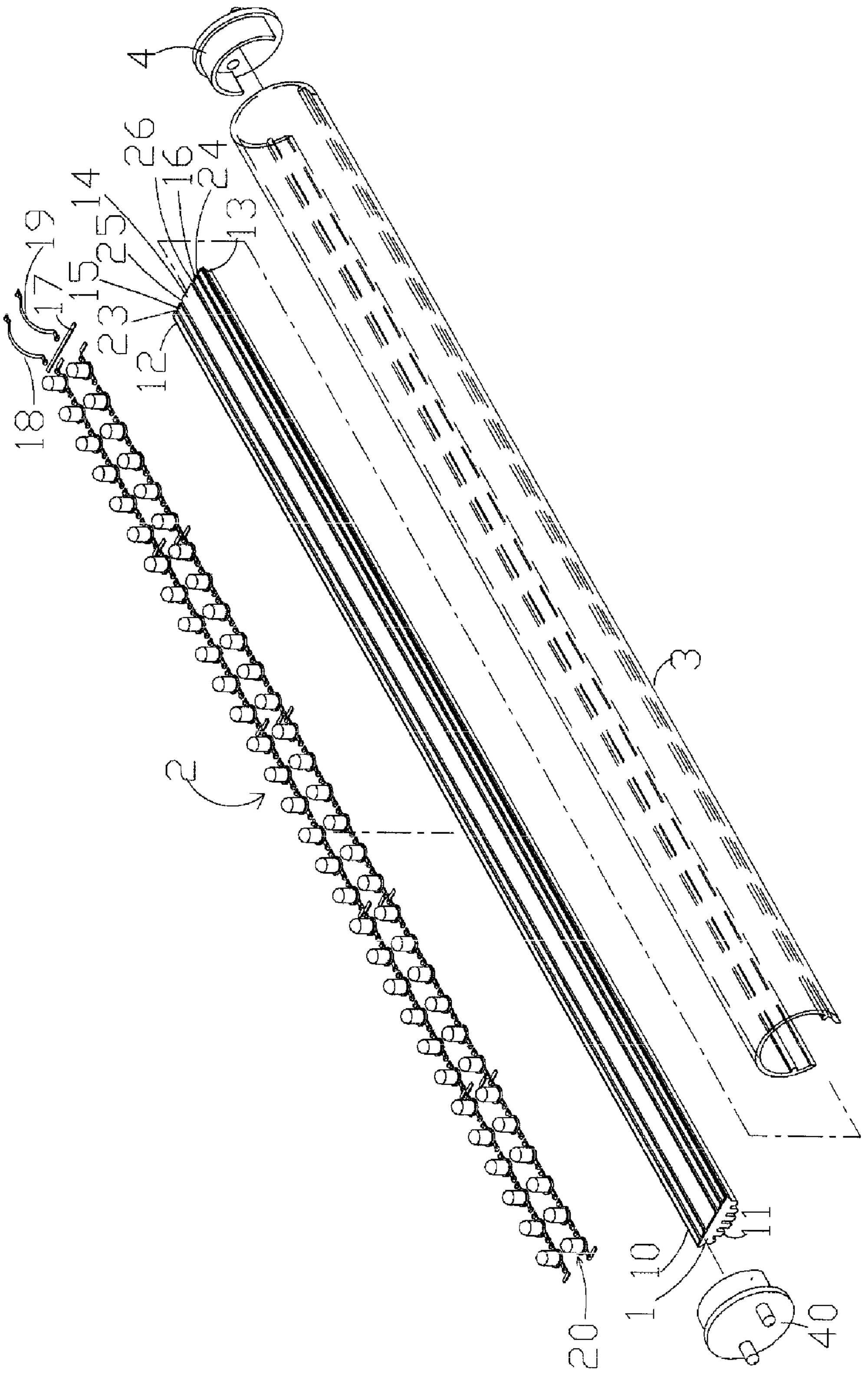
FIG. 2 is an exploded perspective view of the LED lamp of FIG. 1.
Figure 3:
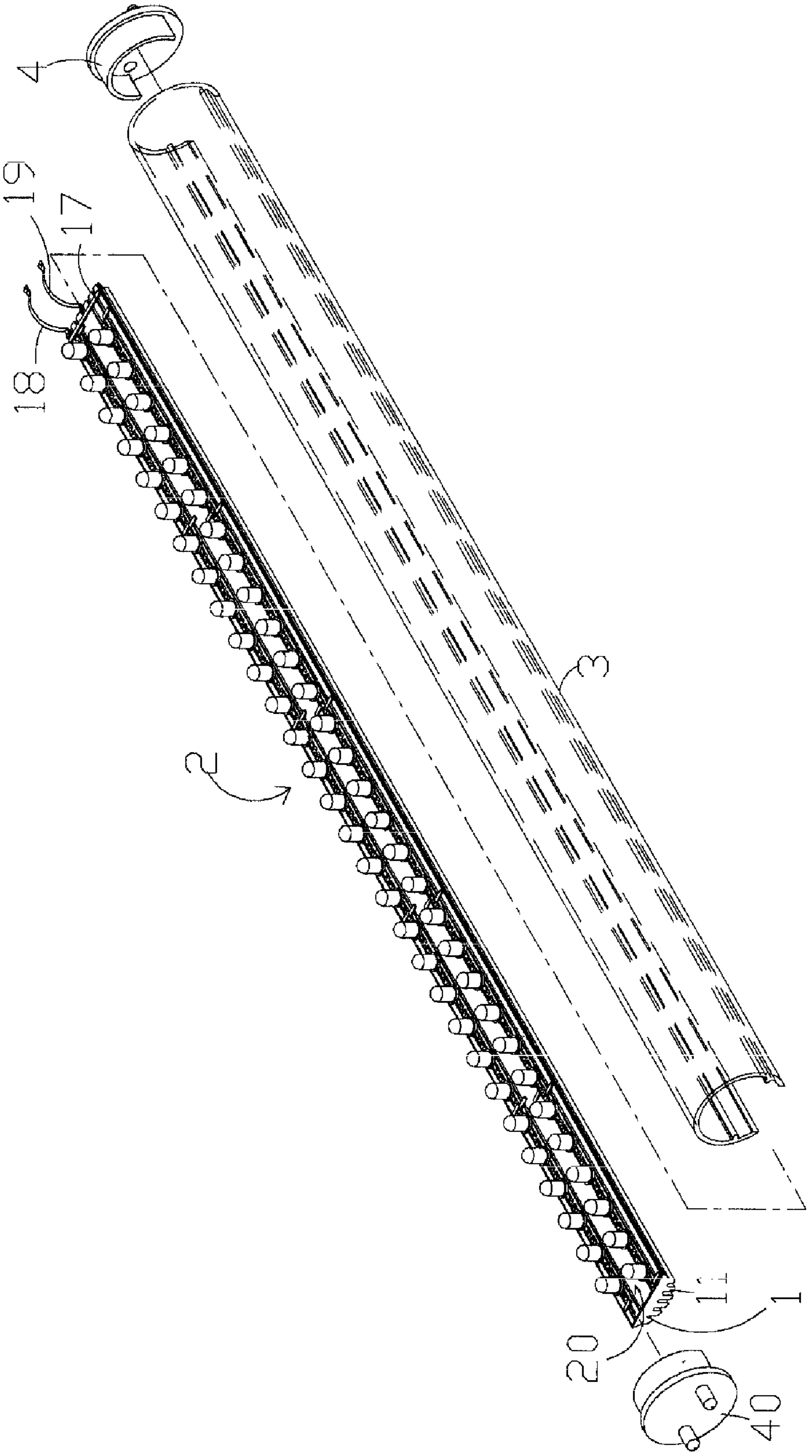
FIG. 3 is an exploded perspective view of the LED lamp of FIG. 2.
Figure 4:
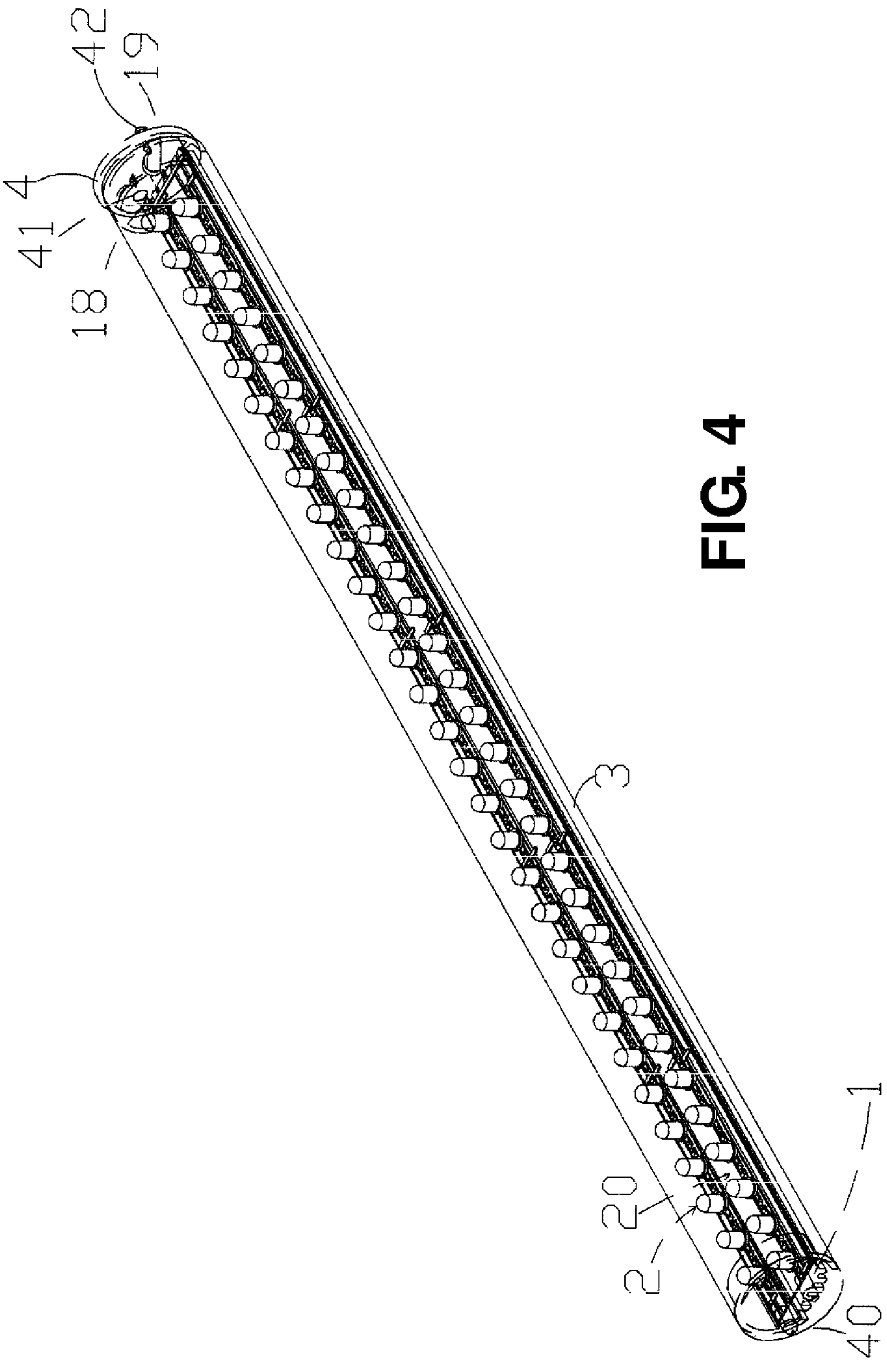
FIG. 4 is a perspective view of the assembled LED lamp of FIG. 3.
Figure 5:
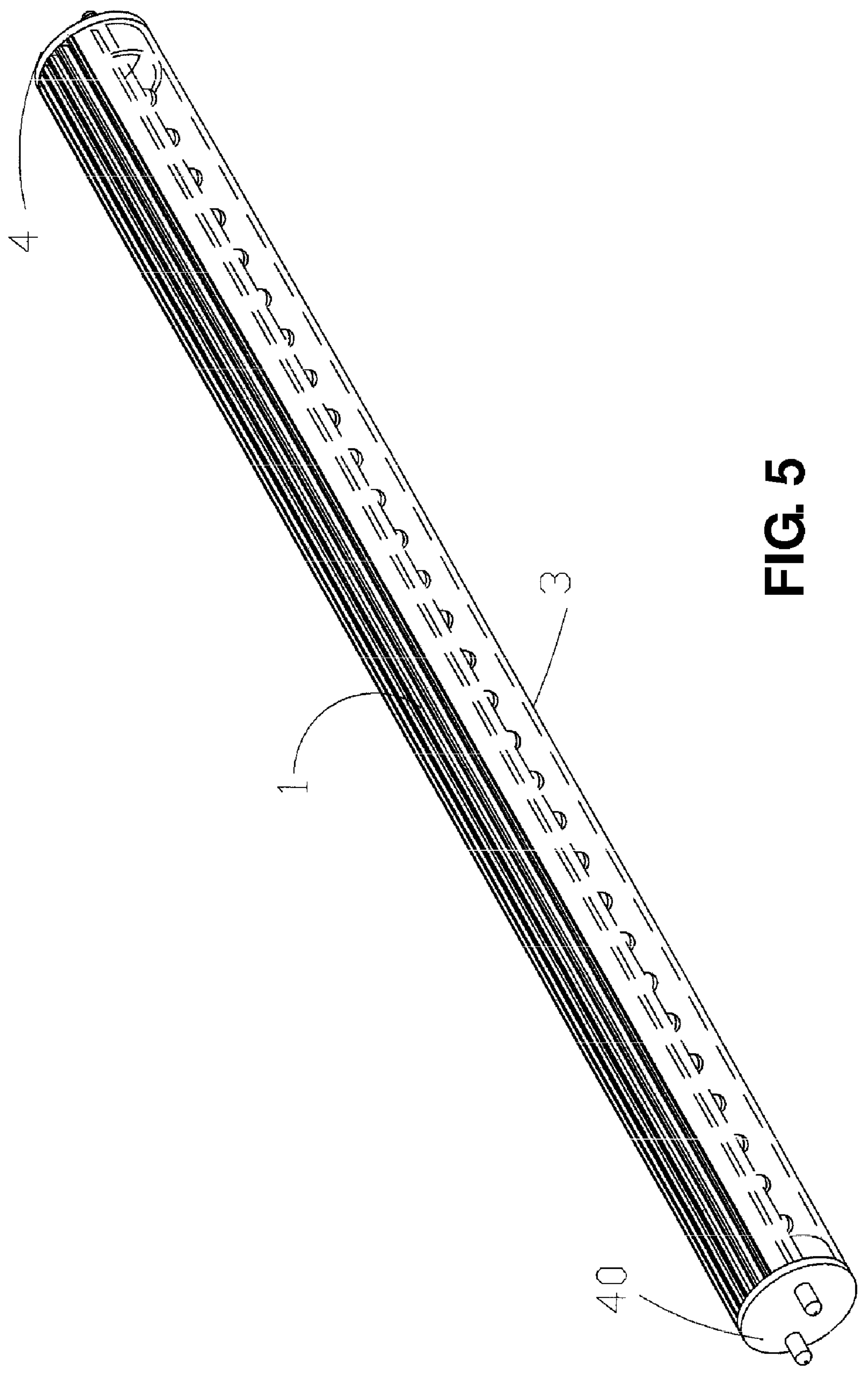
FIG. 5 is another perspective view of the assembled LED lamp of FIG. 3 viewed from bottom.
Figure 6:
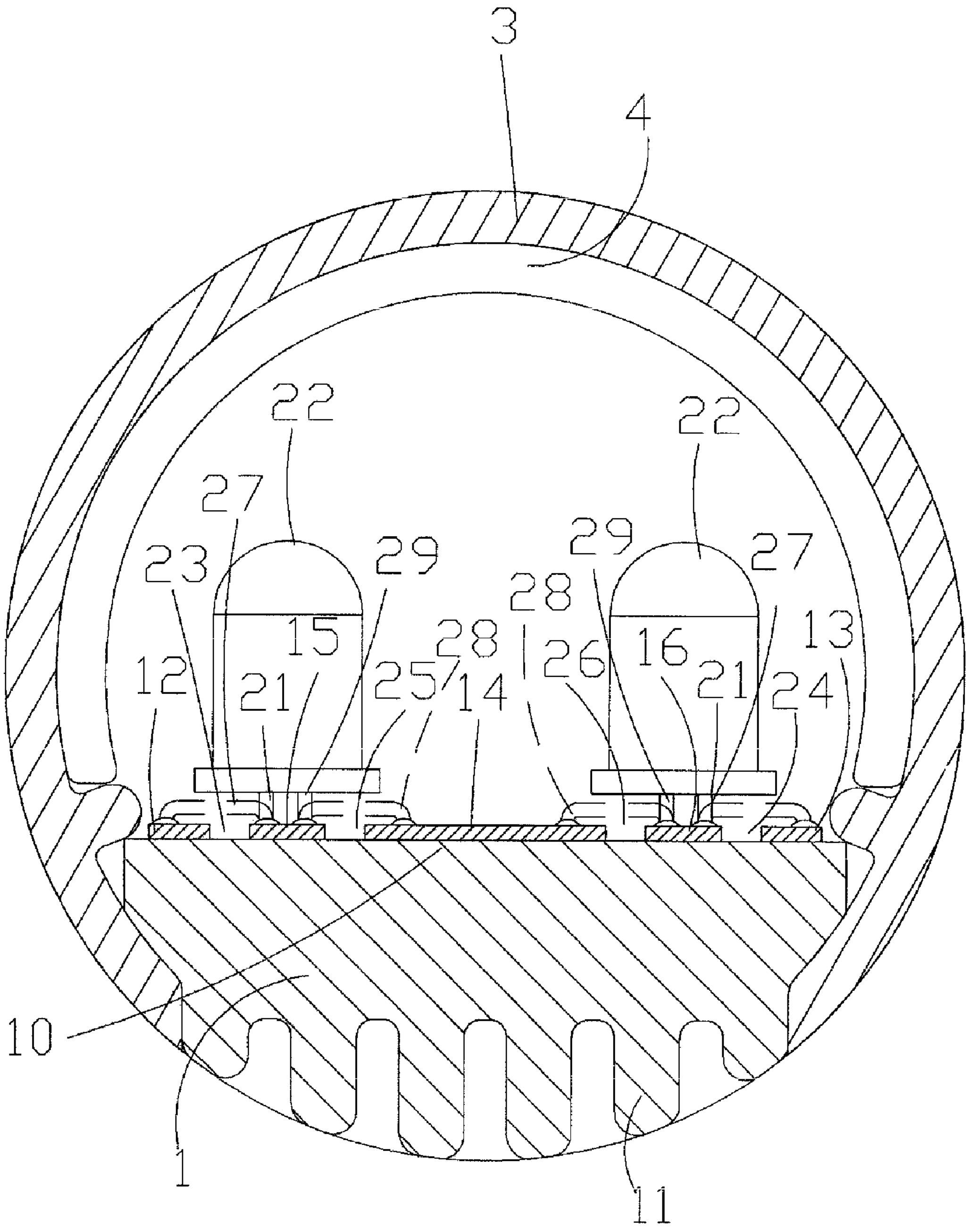
FIG. 6 is a cross-sectional view of the LED lamp of FIG. 4.

Referring to FIGS. 1 to 6, a LED lamp in accordance with a first preferred embodiment of the invention is shown. The LED lamp is shaped as a typical, elongate fluorescent lamp and such shape is for purpose of description only, and is not limiting.

The LED lamp comprises an elongate, rectangular heat sink 1 having an arcuate bottom surface. The heat sink 1 includes a flat top surface 10, and a plurality of rows of lengthwise heat-conductive fins 11 on the bottom surface. On the top surface 10 there are further provided an elongate, rectangular, central negative electrode 14, two elongate, rectangular, side positive electrodes 12 and 13, an elongate, rectangular first conductive positioning strip 15 spaced from and between the negative electrode 14 and one side positive electrode 12, an elongate, rectangular second conductive positioning strip 16 spaced from and between the negative electrode 14 and the other side positive electrode 13, a first insulative strip 23 between one side positive electrode 12 and the first conductive positioning strip 15, a second insulative strip 24 between the other side positive electrode 13 and the second conductive positioning strip 16, a third insulative strip 25 between the first conductive positioning strip 15 and the negative electrode 14, and a fourth insulative strip 26 between the second conductive positioning strip 16 and the negative electrode 14.

The LED lamp further comprises a light array (not numbered) including two rows 2, 20 of LEDs 22. Note that the light array may comprise only one row of LEDs or more than two rows of LEDs in other embodiments. The row 2 or 20 comprises five electrically parallel connected groups each consisting of six electrically series connected LEDs 22. Each LED 22 comprises a positive pin 21 on the base and a spaced negative pin 29 on the base. The first conductive positioning strip 15 is interconnected the positive and negative pins 21 and 29 of the LEDs 22 of one row 2 and the second conductive positioning strip 16 is interconnected the positive and negative pins 21 and 29 of the LEDs 22 of the other row 20. A plurality of positive conductors 27 each is interconnected one side positive electrode 12 and the positive pin 21, and a plurality of negative conductors 28 each is interconnected the negative electrode 14 and the negative pin 29. Moreover, a plurality of positive conductors 27 each is interconnected the other side positive electrode 13 and the positive pin 21, and a plurality of negative conductors 28 each is interconnected the negative electrode 14 and the negative pin 29. Also, the positive conductor 27 is electrically connected to each LED group, and the negative conductor 28 is electrically connected to each LED group and is located proximate the positive conductor 27. An end of the pin 21 or 29 is projected for facilitating soldering.

The negative electrode 14 is electrically connected to a negative terminal of a power source. A conductor 17 is electrically interconnected the positive electrodes 12 and 13 by soldering. That is, the positive electrodes 12 and 13 are parallel connected.

The heat sink 1 is made of a highly heat-conductive material such as aluminum, metal, ceramic, or any of other suitable heat-conductive materials. The electrodes 12, 13 and 14 are made of copper or the like. The conductive positioning strips 15 and 16 are made of copper or the like. The insulative strips 23, 24, 25, and 26 are mounted in grooves. The light array is mounted on the heat sink 1 and components of the heat sink 1 except the heat-conductive fins 11 are mounted on the top surface 10 of the heat sink 1 by adhesive.

The LED lamp further comprises an elongate housing 3 of C-shaped section. The housing 3 is formed of a transparent material and is adapted to fit over the top surface 10 of the heat sink 1 by snapping so as to form a complete cylindrical lighting body with the heat-conductive fins 11 exposed thereunder.

The LED lamp further comprises two end pin bases 4 and 40 in which the pin base 40 is insulative. The pin base 4 comprises a positive pin 41 electrically connected to one side positive electrode 12 via a first conductor 18, and a negative pin 42 electrically connected to the negative electrode 14 via a second conductor 19. Two ends of each of the conductors 18 and 19 are secured by soldering. Moreover, a PCB (printed circuit board) (not shown) is provided in the light array.

Figure 7:
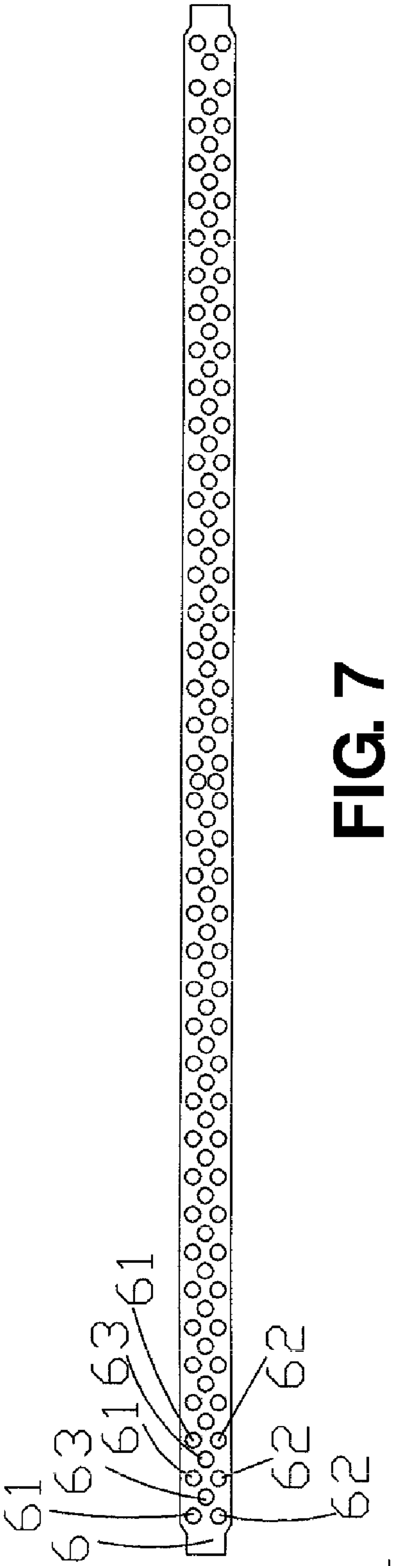
FIG. 7 is a top view of a base plate according to a second preferred embodiment of LED lamp of the invention.
Figure 8:
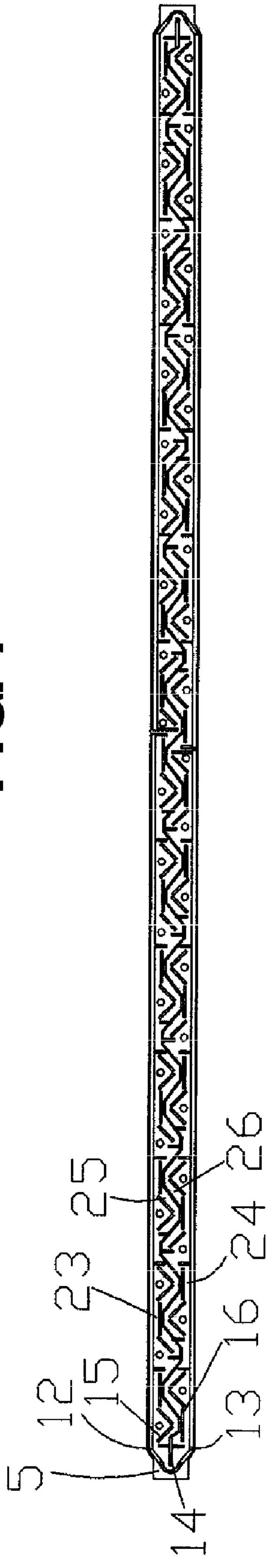
FIG. 8 is a bottom view of a positioning plate according to the second preferred embodiment of LED lamp of the invention.
Figure 9:
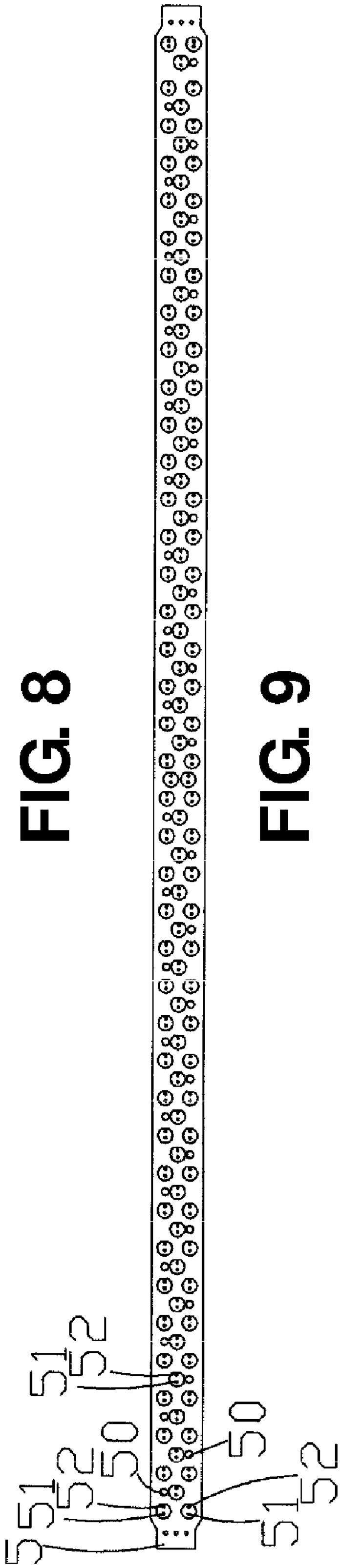
FIG. 9 is a top view of the positioning plate of FIG. 8.
Figure 10:
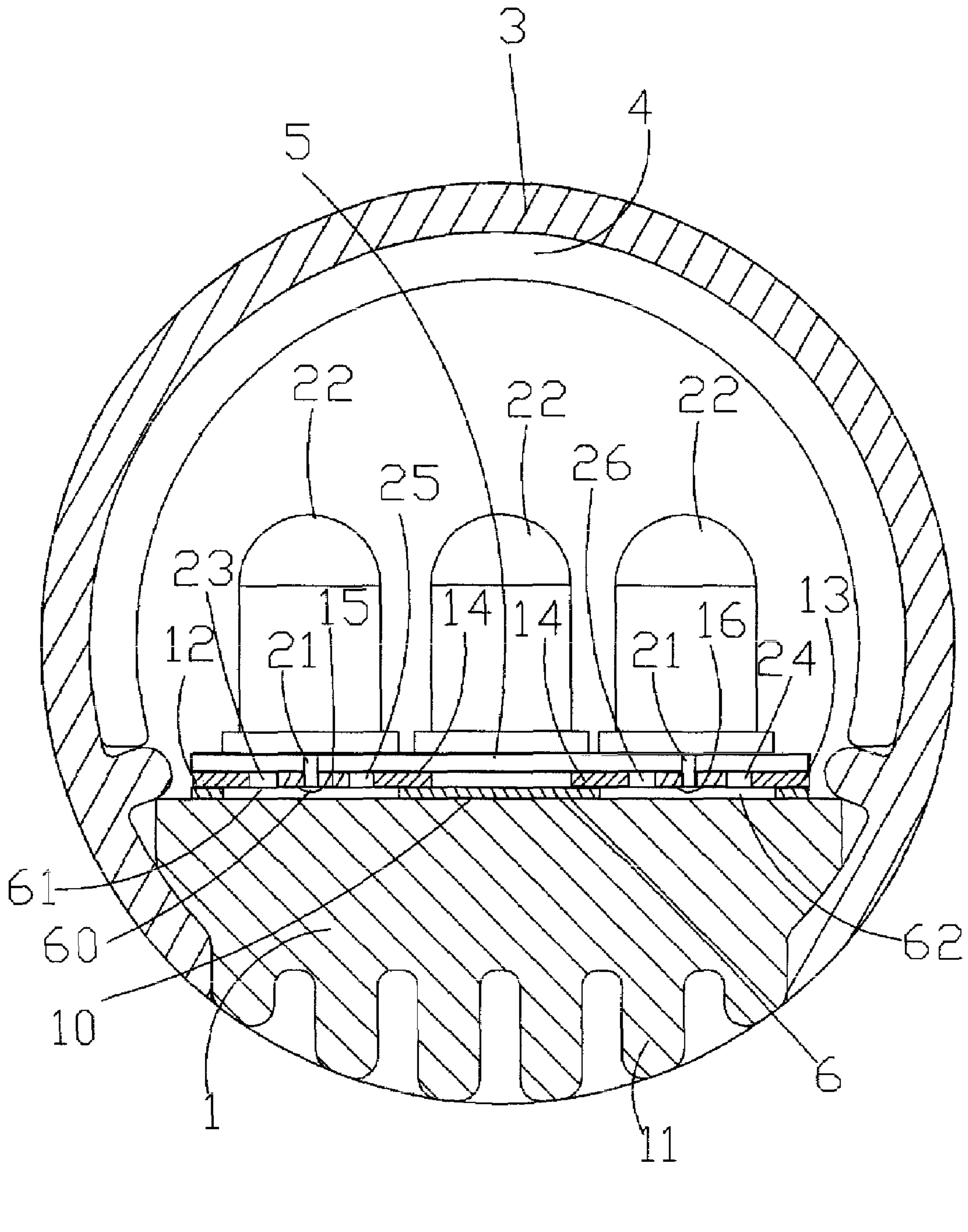
FIG. 10 is a cross-sectional view of the second preferred embodiment of LED lamp of the invention.
Figure 11:
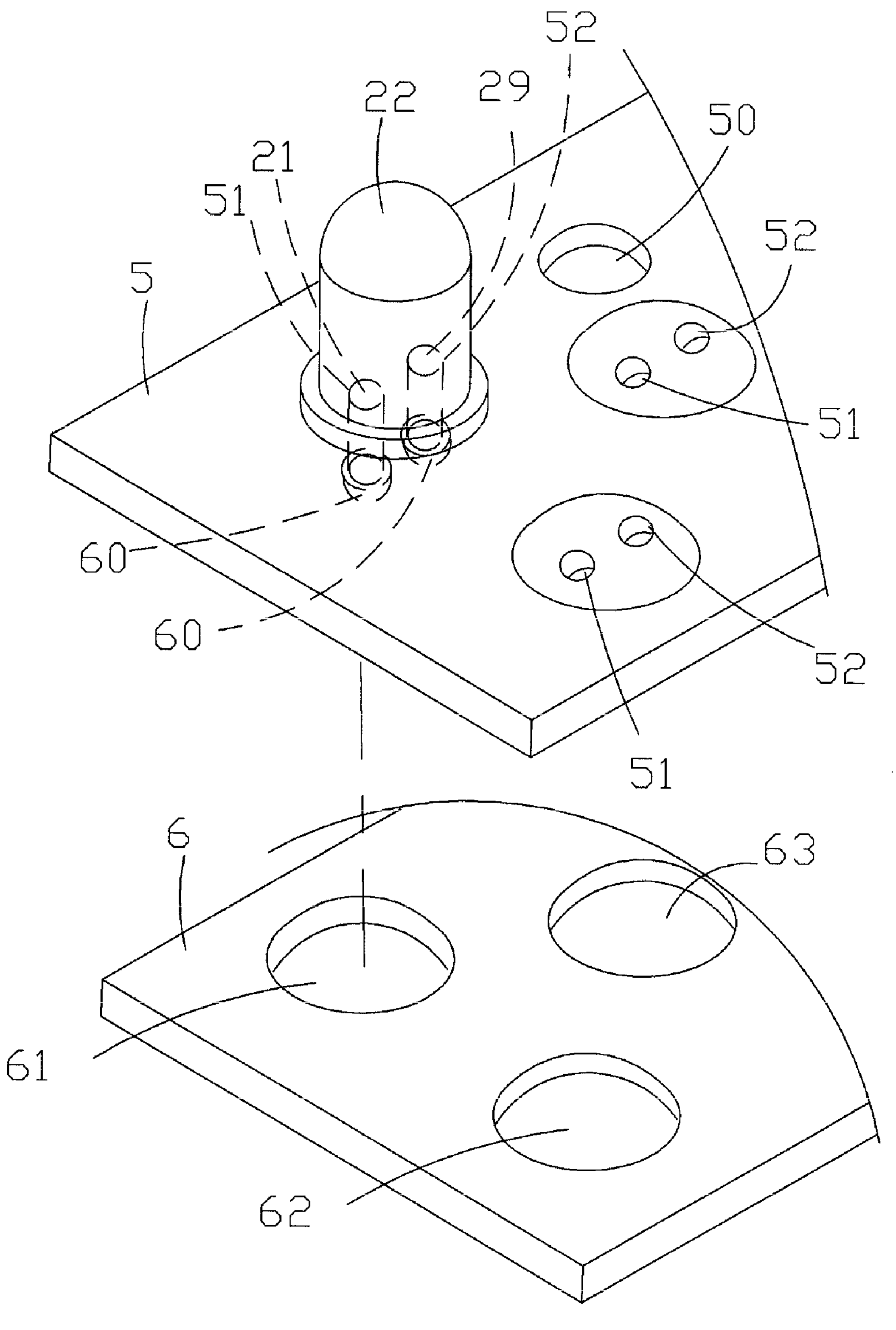
FIG. 11 is an exploded view of the base plate and the positioning plate of the second preferred embodiment of LED lamp of the invention for illustrating their assembly.

Referring to FIGS. 7 to 11, a LED lamp in accordance with a second preferred embodiment of the invention is shown. The characteristics of the second preferred embodiment are detailed below. A base plate 6 is provided on the top surface 10 of the heat sink 1 by threading and a positioning plate 5 is provided above the base plate 6 also by threading. Three rows of LEDs 22 are provided. A plurality of sets of holes 51 and 52 are provided through the positioning plate 5 with the positive and negative pins 21 and 29 of each LED 22 snugly passing through each set of holes 51 and 52 respectively. Three rows of apertures 61, 62, and 63 are provided through the base plate 6 and each row of apertures correspond to each row of LEDs 22. A solder point 60 is formed on a bottom mouth of each aperture 61, 62, or 63. As a result, the positioning plate 5 is secured above the heat sink 1. The positive electrodes 12 and 13 are provided on both sides and the zigzag negative electrode 14 is provided lengthwise between the positive electrodes 12 and 13. All of the electrodes 12, 13 and 14 are secured between the positioning plate 5 and the base plate 6.

There are provided a plurality of zigzag first conductive positioning strips 15 spaced from and between the negative electrode 14 and one side positive electrode 12, a plurality of zigzag second conductive positioning strips 16 spaced from and between the negative electrode 14 and the other side positive electrode 13, a first insulative strip 23 between one side positive electrode 12 and the first conductive positioning strips 15, a second insulative strip 24 between the other side positive electrode 13 and the second conductive positioning strips 16, a third insulative strip 25 between the first conductive positioning strips 15 and the negative electrode 14, and a fourth insulative strip 26 between the second conductive positioning strips 16 and the negative electrode 14. Four LEDs 22 are formed as a group.

The positioning plate 5 and the base plate 6 are made of a highly heat-conductive material such as aluminum, metal, ceramic or the like. Moreover, a plurality of ventilation holes 50 are formed through the positioning plate 5 for increasing the heat dissipation performance of the invention.

In brief, the heat sink made of a highly heat-conductive material such as aluminum or metal can quickly draw generated heat away from the LEDs by conduction during illumination. As a result, the LED temperature is kept low to ensure sufficient light production and the LED lamp thus has other advantageous benefits such as high durability, long life span and low power consumption.

While the invention herein disclosed has been described by means of specific embodiments, numerous modifications and variations could be made thereto by those skilled in the art without departing from the scope and spirit of the invention set forth in the claims.

What is claimed is:

1. An LED lamp comprising:

a heat sink including a plurality of exposed heat-conductive fins and conductive means opposite the fins and including two electrically connected side positive electrodes, one or more negative electrode spaced from and between the positive electrodes, and one or more conductive positioning strips each between the negative electrode and either one of the positive electrodes;

a light array mounted on the conductive means and including a plurality of rows of LEDs (light-emitting diodes), the LEDs being divided into a plurality of electrically parallel connected groups with the LEDs of each group being electrically series connected together, each of the LEDs including extending positive and negative pins secured to one of the conductive positioning strips and electrically connected to either one of the positive electrodes and the negative electrode respectively;

a positive conductor electrically connected to either one of the positive electrodes;

a negative conductor electrically connected to the negative electrode;

a positioning plate between the rows of LEDs and the conductive means, wherein the positioning plate includes a plurality of pairs of through holes with the positive and the negative pins of each LED securely passing through respectively; and a base plate between the conductive means and the sink, and wherein the base plate includes a plurality of apertures each aligned with the through hole so that the positive and the negative pins of each LED are adapted to pass through the apertures to secure to the sink by soldering.

2. The LED lamp of claim 1, wherein the base plate is formed of a heat-conductive material.

3. The LED lamp of claim 2, wherein the heat-conductive material is aluminum, metal, or ceramic.

* * * * *